United States Patent
Yamaguchi et al.

(10) Patent No.: US 9,203,399 B2
(45) Date of Patent: Dec. 1, 2015

(54) DRIVE CIRCUIT FOR SWITCHING ELEMENT

(71) Applicant: DENSO CORPORATION, Kariya, Aichi-pref. (JP)

(72) Inventors: Akihiro Yamaguchi, Anjo (JP); Takanari Sasaya, Toyokawa (JP)

(73) Assignee: DENSO CORPORATION, Kariya (JP)

( * ) Notice: Subject to any disclaimer, the term of this patent is extended or adjusted under 35 U.S.C. 154(b) by 50 days.

(21) Appl. No.: 14/353,890

(22) PCT Filed: Oct. 24, 2012

(86) PCT No.: PCT/JP2012/006810
§ 371 (c)(1),
(2) Date: Apr. 24, 2014

(87) PCT Pub. No.: WO2013/076916
PCT Pub. Date: May 30, 2013

(65) Prior Publication Data
US 2014/0306739 A1    Oct. 16, 2014

(30) Foreign Application Priority Data

Nov. 24, 2011 (JP) ................. 2011-256147

(51) Int. Cl.
*H02B 1/00*   (2006.01)
*H03K 17/56*  (2006.01)
*H03K 17/042* (2006.01)
*H03K 17/0424* (2006.01)
*H02M 1/08*   (2006.01)
*H02M 3/158*  (2006.01)

(52) U.S. Cl.
CPC ............ *H03K 17/56* (2013.01); *H03K 17/0424* (2013.01); *H03K 17/04206* (2013.01); *H02M 1/08* (2013.01); *H02M 3/158* (2013.01)

(58) Field of Classification Search
CPC ........................................................ H02B 1/056
USPC ........................................................ 361/600
See application file for complete search history.

(56) References Cited

U.S. PATENT DOCUMENTS

2004/0017245 A1    1/2004   Mochizuki

FOREIGN PATENT DOCUMENTS

| JP | 08-298211 A | 11/1996 |
| JP | 10-225135 A | 8/1998 |
| JP | 2000-134075 A | 5/2000 |

(Continued)

OTHER PUBLICATIONS

International Search Report of the International Searching Authority mailed Nov. 20, 2012 for the corresponding international application No. PCT/JP2012/006810 (with English translation).

(Continued)

*Primary Examiner* — Daniel Puentes
(74) *Attorney, Agent, or Firm* — Posz Law Group, PLC

(57) ABSTRACT

A driving circuit for a switching element includes a main current wiring and a substrate. The main current wiring has a flat surface and carries a main current. The substrate has a flat surface mounted on the flat surface of the main current wiring and includes a coil disposed inside. The coil is disposed so as to interlink with a magnetic flux generated depending on the main current of the switching element and is electrically connected such that the coil receives the pulse signal of the signal source and transmits the pulse signal to a control terminal of the switching element.

10 Claims, 11 Drawing Sheets

(56) References Cited

FOREIGN PATENT DOCUMENTS

| JP | 2006-025071 A | 1/2006 |
| JP | 2008-235997 A | 10/2008 |

OTHER PUBLICATIONS

Written Opinion of the International Searching Authority mailed Nov. 20, 2012 for the corresponding international application No. PCT/JP2012/006810 (with English translation).

DRIVE CIRCUIT FOR SWITCHING ELEMENT

CROSS REFERENCE TO RELATED APPLICATION

The present application is a U.S. national stage application of PCT/JP2012/006810 filed on Oct. 24, 2012 and is based on Japanese Patent Application No. 2011-256147 filed on Nov. 24, 2011, the contents of which are incorporated herein by reference.

TECHNICAL FIELD

The present disclosure relates to a drive circuit for a switching element.

BACKGROUND ART

A drive circuit for a switching element turns on and off the switching element by controlling a voltage applied to a control terminal of the switching element. In this case, a main factor determining an on-off time of the switching element is a charging and discharging time depending on a parasitic capacitance.

The charging and discharging time of the parasitic capacitance depends on a current value that flows from the drive circuit to the control terminal of the switching element. Thus, it is preferable that the current value flowing to the control terminal is increased so as to shorten the charging and discharging time. This kind of technique is described, for example, in the patent document 1. The patent document 1 discloses a configuration that forcibly brings the voltage applied to the switching element close to a power supply voltage.

In other words, the conventional drive circuit speeds up a switching operation by increasing the current value that flows from the control terminal of the switching element to the parasitic capacitance. However, in this case, it is required to increase a current supply capacity of the drive circuit. In order to solve this problem, in the patent document 2, an inductor is disposed around a current path that carries a main current of the switching element, and an induction voltage generated at the inductor is superimposed on the voltage applied to the control terminal of the switching element. The patent document 2 suggests that the above-described operation enables a high-speed operation of the switching element without increasing the current supply capacity of the drive circuit.

How to arrange an inductor with respect to a main current path becomes a problem in order to utilize the technique described in the patent document 2. In the technique described in the patent document 2, a ring-shaped ferrite core and a coil wound around the ring-shaped core are used. However, because the core is formed into the ring-shape, it is difficult to fix the core. In addition, because the core is disposed around the main current path,. a large arrangement space is required.

PRIOR ART DOCUMENTS

Patent Document

[Patent Document 1] JP-A-2006-25071
[Patent Document 2] JP-A-2008-235997

SUMMARY OF INVENTION

An object of the present disclosure is to provide a drive circuit for a switching element that enables the coil to be fixed easily and reduces an installation space.

A drive circuit according to an aspect of the present disclosure includes a switching element, a main current wiring, and a substrate. The switching element is on-off controlled depending on a pulse signal transmitted from a signal source and carries a main current. The main current wiring has a flat surface and carries the main current of the switching element. The substrate has a flat surface mounted on a flat surface of the main current wiring and has a coil disposed therein. The coil is disposed so as to interlink with a magnetic flux generated depending on the main current of the switching element and is electrically connected such that the coil receives the pulse signal of the signal source and transmits the pulse signal to a control terminal of the switching element.

In this case, because the flat surfaces of the main current wiring and the substrate become close-contact surfaces, an installation space can be reduced. Furthermore, because both of the close-contact surfaces of the substrate and the main current wiring are flat surfaces, they can be fixed easily.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION (First Embodiment)

Figure 1:
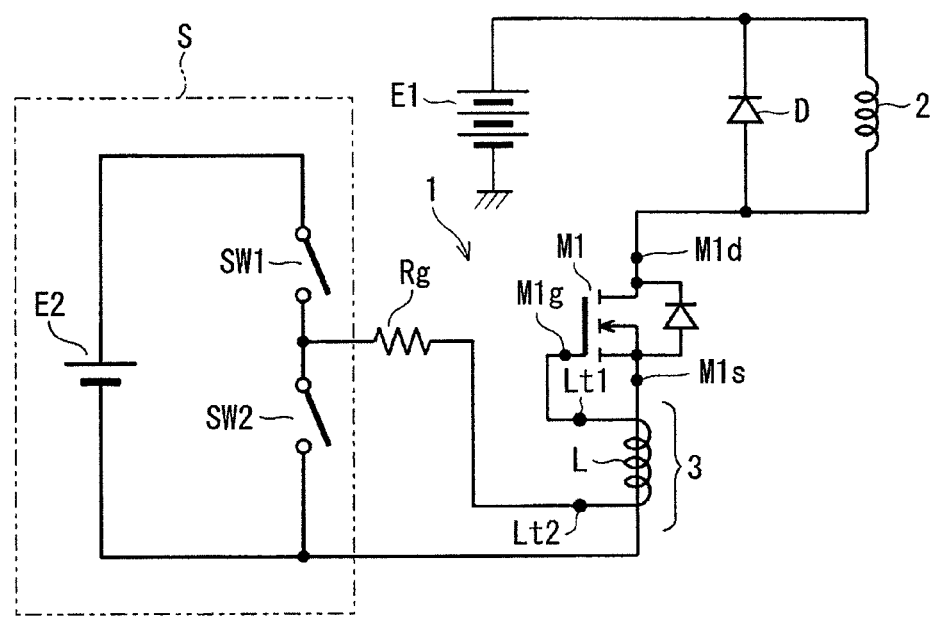
FIG. 1 is a circuit diagram illustrating an example of a drive circuit for a switching element according to a first embodiment of the present disclosure.

A drive circuit 1 for a switching element M1 according to a first embodiment of the present disclosure will be described with reference to FIG. 1 through FIG. 8. As illustrated in FIG. 1, the switching element M1 is formed of, for example, an N-channel type MOS transistor and is connected in series with an inductive load 2. The inductive load 2 is connected in parallel with a free wheel diode D.

The series connection circuit of the switching element M1 and the inductive load 2 is applied with a direct current voltage E1. The direct current voltage E1 is a main power supply voltage of the series connection circuit. To a gate terminal (control terminal) M1g of the switching element M1, a signal source S and the drive circuit 1 are connected.

The signal source S includes control switches SW1 and SW2 connected in series between positive and negative terminals of a direct current voltage source E2 and outputs a pulse signal. The drive circuit 1 is formed by combining a gate resistor Rg and a coil L with the signal source S. The drive circuit 1 performs an on-off control of the switching element M by applying the pulse signal (e.g., PWM signal) to a gate of the switching element M1. The drive circuit 1 may include or exclude the signal source S as a component.

The coil L is formed in a multilayer wiring board 8 described later. The coil L is disposed at a surrounding of a current path 3 of a main current that flows to a source terminal (output terminal) M1s of the switching element M1 and generates an induction voltage depending on change in flowing current due to an electromagnetic induction action of the flowing current of the current path 3.

One terminal Lt1 of the coil L is connected to the gate terminal M1g of the switching element M1 and the other terminal Lt2 is connected to a signal output side of the gate resistor Rg.

Figure 2A:
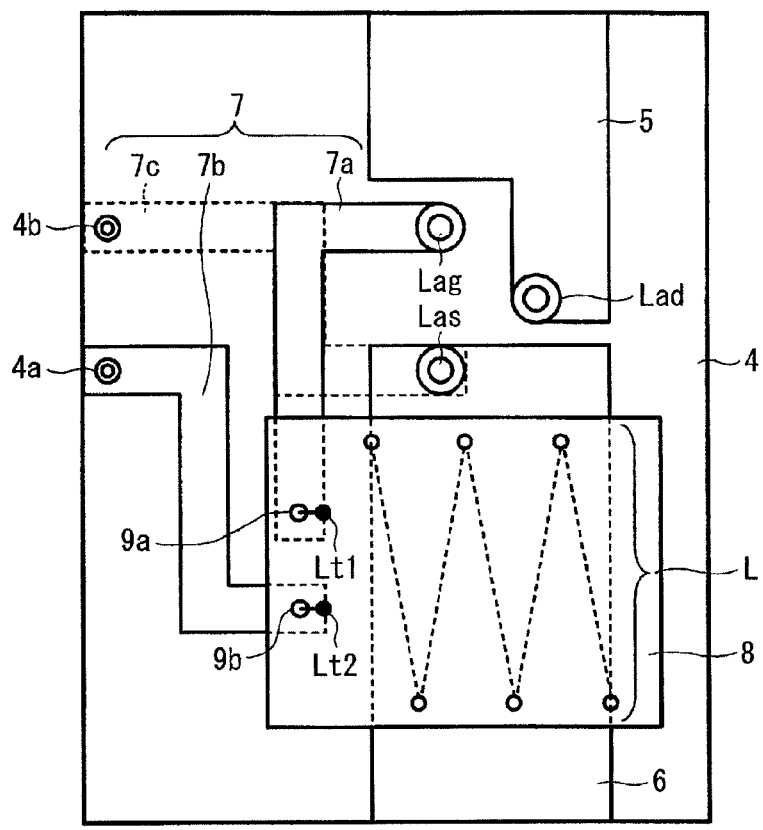
FIG. 2(a) is a plan view of a portion including a connection portion of the switching element and a coil in the drive circuit for the switching element according to the first embodiment.

The main current carrying substrate 4 is formed by using glass epoxy resin as a substrate. As illustrated in FIG. 2(a), a wiring pattern is formed on the substrate from metal such as a copper film. On a front surface of the main current carrying substrate 4, a main current wiring (wiring pattern) 5 for carrying a drain current and a main current wiring (wiring pattern) 6 for carrying a source current are formed. In addition, on the front surface and a rear surface of the main current carrying substrate 4, a gate voltage application wiring (wiring pattern) 7 is formed by a pattern narrower than a wiring width of each of the main current wirings 5, 6.

The gate voltage application wiring 7 includes a plurality of wirings 7a-7c. A land Lag for gate connection is formed at one end of the wiring 7a, and a connection terminal with the coil L is provided at the other end of the wiring 7a. A part of the wiring 7a extends in the same direction as a current carrying direction (vertical direction of FIG. 2(a)) of the main current wiring 6 for carrying the source current and is formed to be parallel with the main current wiring 6.

The other end of the wiring 7a is connected with the connection terminal 9a of the coil L formed in the multilayer wiring board 8 by soldering. Accordingly, the wiring 7a is electrically connected with the one terminal Lt1 of the coil L. A structure and an arrangement position in the multilayer wiring board 8 will be described later. One terminal of the wiring 7b is connected with a connection terminal 9b of the coil L by soldering. Accordingly, the wiring 7b is electrically connected with the other terminal Lt2 of the coil L. At the other end of the wiring 7b, a land 4a for connecting the gate resistor Rg disposed in a side portion of the main current carrying substrate 4 is formed.

The wiring 7c is disposed on the rear surface of the main current carrying substrate 4. A land Las is formed at one end of the wiring 7c. A land 4b is formed at the other end of the wiring 7c so as to be located at a side portion of the main current carrying substrate 4. The land Las is also formed at a pattern end portion of the main current wiring 6. The land Las penetrates and is connected from the front surface to the rear surface by a through hole. Accordingly, the main current wiring 6 for carrying the source current and the wiring 7c are electrically connected. A land Lad for connecting a drain is formed at a pattern end portion, and a through hole is provided in the land Lad for connecting the drain.

Figure 2B:
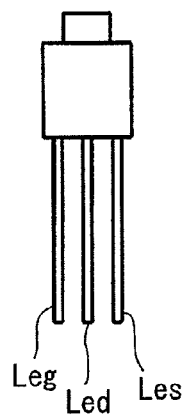
FIG. 2(b) is a diagram illustrating a structural example of a discrete switching element.

As illustrated in FIG. 2(b), the switching element M1 is electrically configured in, for example, TO (transistor outline) package. A plurality of lead terminals Leg (gate), Led (drain), and Les (source) extend outward of the package. The lead terminals Leg, Led, Les are inserted in through holes provided in the respective lands Lag, Lad, Las of the main current carrying substrate 4 and are fixed by soldering.

Figure 2C:
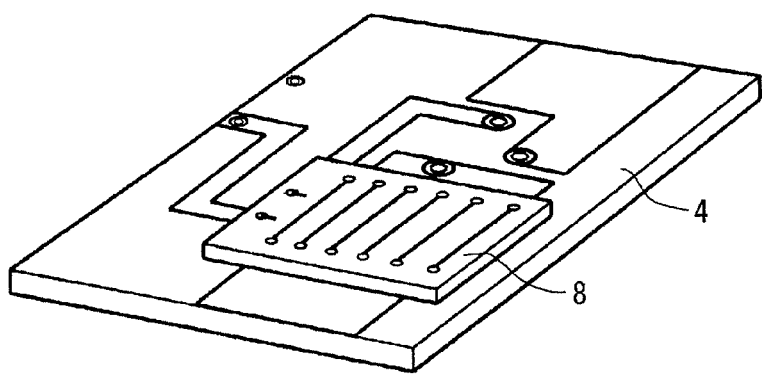
FIG. 2(c) is a perspective view illustrating an installation example of a multilayer wiring board with respect to a main current carrying substrate.

As illustrated in FIG. 2(a) and FIG. 2(c), the multilayer wiring board 8 is mounted on the main current wiring 6 of the main current carrying substrate 4. The coil L illustrated in FIG. 1 is formed of a metal wiring inside the multilayer wiring board 8.

As illustrated in FIG. 3(a) through FIG. 3(d), each of a first layer 8a through a fourth layer 8d of the multilayer wiring board 8 includes a plate-shaped substrate made of glass epoxy resin and a wiring pattern made of metal and formed on an upper surface of the substrate.

A lower surface of the first layer 8a is formed into a flat surface and becomes a mounted surface that is mounted on an upper surface of the main current wiring 6 (the main current carrying substrate 4). The first layer 8a through the fourth layer 8d are connected via through holes (corresponding to via holes) H1-H6 arranged in zigzags from a side of the multilayer wiring board 8 close to the connection terminals 9a and 9b to an opposite side of the multilayer wiring board 8. In addition, the connection terminals 9a and 9b are formed, and the connection terminals 9a and 9b are connected by the through holes penetrating the first layer 8a through the fourth layer 8d.

Figure 3A:
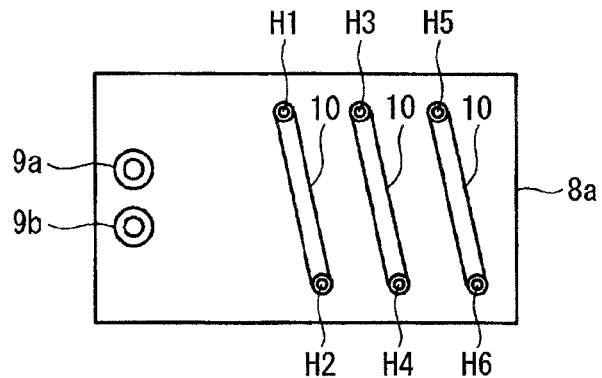
FIG. 3(a) is a plan view illustrating a wiring pattern of a first layer in a multilayer wiring board.
Figure 3B:
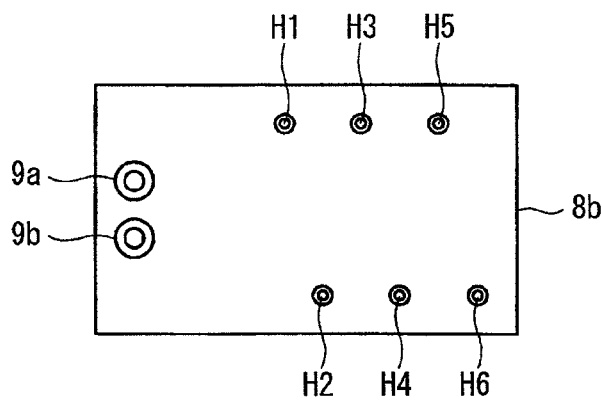
FIG. 3(b) is a plan view illustrating a wiring pattern of a second layer in the multilayer wiring board.
Figure 3C:
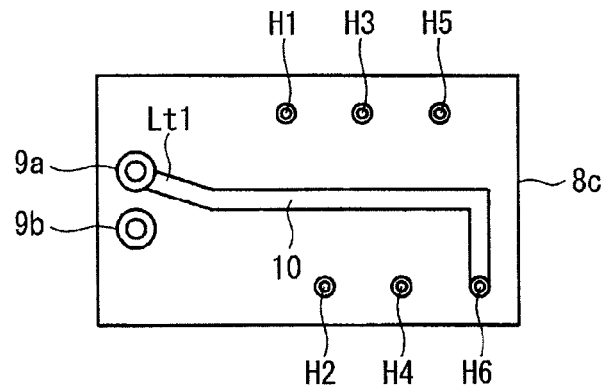
FIG. 3(c) is a plan view illustrating a wiring pattern of a third layer in the multilayer wiring board.

As illustrated in FIG. 3(a), on the front surface of the first layer 8a, metal wirings 10 connect the through holes H1 and H2, H3 and H4, and H5 and H6. In addition, on the front surface of the third layer 8c illustrated in FIG. 3(c), a metal wiring 10 connects the connection terminal 9a and the through hole H6.

Figure 3D:
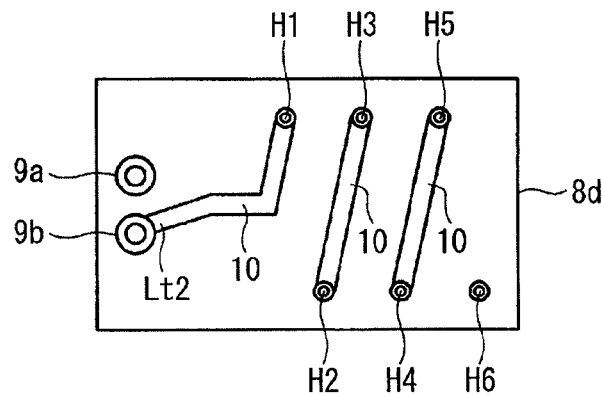
FIG. 3(d) is a plan view illustrating a wiring pattern of a fourth layer in the multilayer wiring board.

Furthermore, as illustrated in FIG. 3(d), on the front surface of the fourth layer 8d, metal wirings 10 connect the connection terminal 9b and the through hole H1, the through holes H2 and H3, and the through holes H4 and H5.

Accordingly, a carrying path of electric current is formed to pass the connection terminal 9a, the through hole H6, the metal wiring 10 between H6 and H5 in the first layer 8a, the through hole H5, the metal wiring 10 between H5 and H4 in the fourth layer 8d, the through hole H4, . . . , the through hole H1, and the metal wiring 10 between H1 in the fourth layer 8d and the connection terminal 9b.

Thus, the coil L can be formed by forming the current path into a loop shape using the metal wirings 10 and the through holes H1-H6. One terminal Lt1 of the coil L is connected to the connection terminal 9a and the other terminal Lt2 is connected to the connection terminal 9b. In order to simplify explanation, an example in which a wiring of the coil L is wound three times has been described. Practically, a coil L having a winding number greater than 3 may also be used to improve sensitivity. In addition, in order to reduce the installation space, a coil L having a winding number less than 3 may also be used.

Figure 4:
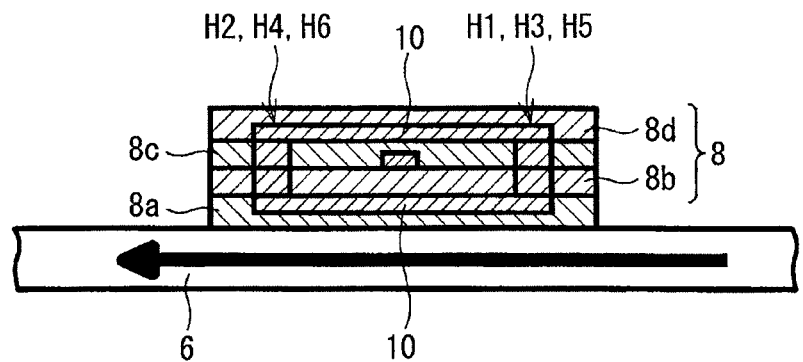
FIG. 4 is a vertical cross-sectional view illustrating a structure of the multilayer wiring board.

As illustrated in FIG. 4, the multilayer wiring board 8 is in close contact with and is mounted on the main current wiring 6. Although the first layer (the lowest layer) 8a of the multilayer wiring board 8 is formed of the substrate made of glass epoxy resin, an insulation layer, such as solder resist, for protecting a circuit pattern is disposed between the first layer 8a and the main current wiring 6.

Accordingly, insulation between the main current wiring 6 and the multilayer wiring board 8 is secured. A thin insulation layer made of, for example, polyimide may also be separately formed in order to enhance insulation.

Figure 5:
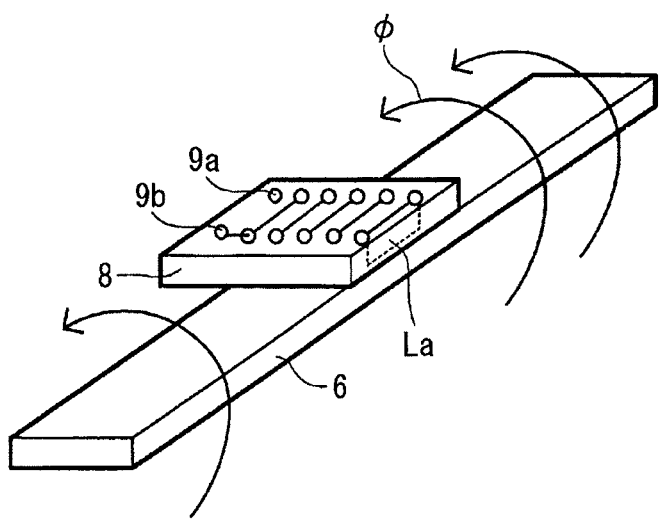
FIG. 5 is a diagram for explaining a direction of magnetic flux generated around a main current wiring.

As illustrated in FIG. 4, the coil L is connected into the loop shape surrounded by the metal wirings 10 and the through holes H1-H6 in each of the layers 8a-8d. As illustrated in FIG. 5, when electric current flows in the main current wiring 6, a magnetic flux φ is generated around the main current wiring 6 and interlinks with an aperture La of the coil L formed in the multilayer wiring board 8. Then, the coil L generates an induction voltage.

Figure 6:
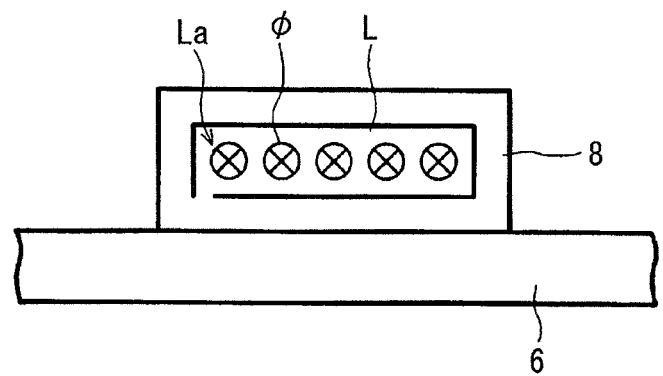
FIG. 6 is an image diagram of a magnetic flux interlinking with the coil in the multilayer wiring board.

As illustrated in FIG. 6, the magnetic flux interlinks with the aperture of the coil in the multilayer wiring board. An interlinkage direction of the magnetic flux is a direction perpendicular to a printing surface of FIG. 6. Because an interlinkage number of the magnetic flux φ increases with a dimension of the aperture La of the coil L, the sensitivity of induction voltage depending on current variation can be improved.

Thus, although a four-layer structure is applied to the multilayer wiring board 8, a multilayer wiring board is not limited to this. When an area through which a magnetic flux passes is increased, a multilayer wiring board having more than four layers may also be used. In contrast, in order to effectively use a space surrounding the main current wiring 6, it is preferable that a thickness of the multilayer wiring board 8 is reduced. In this aspect, the multilayer wiring board 8 may also be formed of a two-layer double-sided substrate or three-layer substrate, and the coil L may be disposed therein. In other words, the number of layers of the multilayer wiring board 8 may be set optionally.

Figure 7:
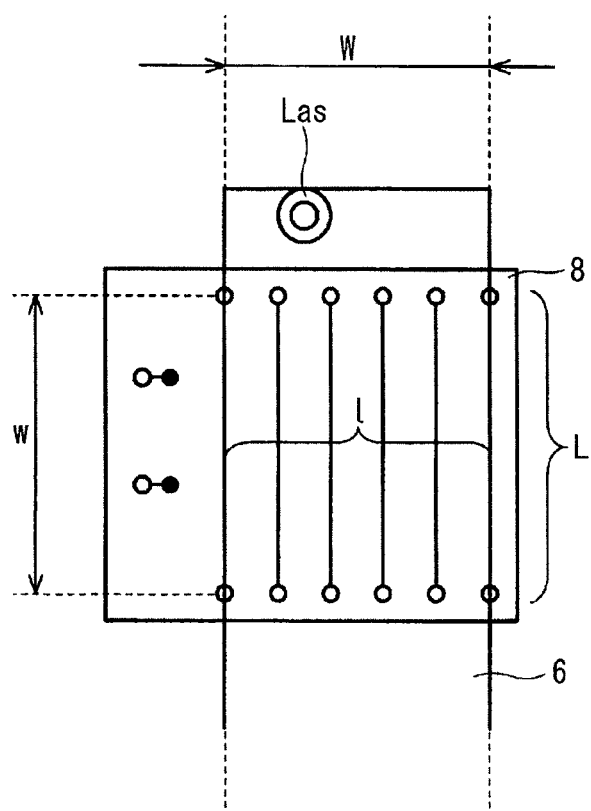
FIG. 7 is a plan view illustrating an arrangement relationship between the coil and the main current wiring.

The coil and the main current wiring are arranged as illustrated in FIG. 7. As described above, it is preferable that the coil L is wound more than two (multiple) turns in the multilayer wiring board 8. However, it is preferable that a length I between winding ends of the coil L is less than or equal to a wiring width W of the main current wiring 6, and the coil L is disposed within the wiring width W in a plane.

Although it is omitted in FIG. 2 and the like, a different circuit (not shown) is mounted on the main current carrying substrate 4. A magnetic flux φ depending on electric current flowing in the different circuit is less likely to interlink with the coil L Accordingly, an influence of the current flowing in a different wiring can be restricted as much as possible. A relationship between a coil width w of the coil L and the wiring width W of the main current wiring 6 may be set such that one of them is longer than the other or they are almost the same.

Figure 8A:
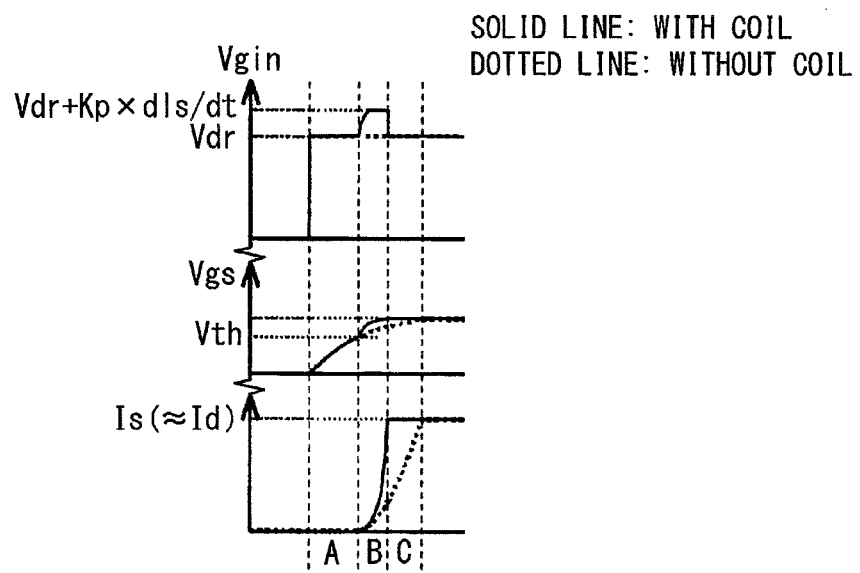
FIG. 8(a) is a timing chart explaining an on-operation of the switching element.

An operation of the above-described configuration will be described with reference to FIG. 8(a) and FIG. 8(b).

Figure 8B:
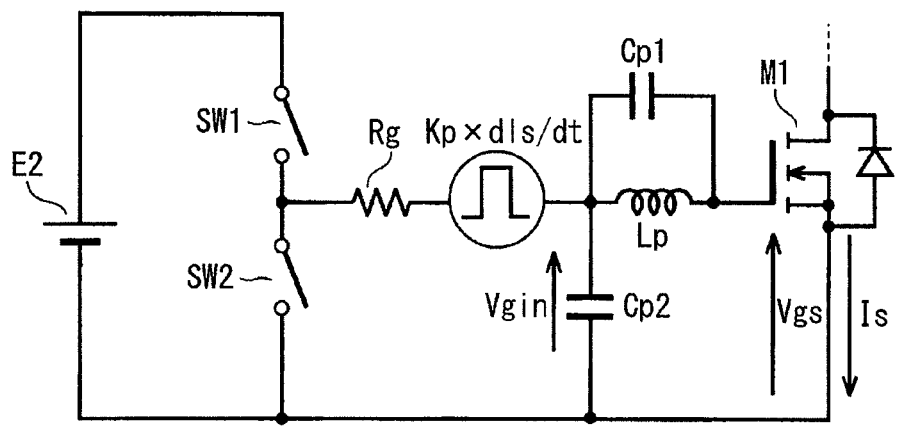
FIG. 8(b) is an equivalent circuit diagram in consideration of a parasitic component of the coil.

As illustrated in an equivalent circuit in FIG. 8(b), a parasitic capacitance Cp1, a parasitic capacitance Cp2, and a parasitic inductor Lp exist in the coil L as illustrated. When the drive circuit 1 applies a step-like gate voltage Vdr from the voltage source E2 to the control terminal of the switching element M1 (the gate of the MOSFET) by turning on the control switch SW1 and turning off the control switch SW2, as illustrated in FIG. 8(a), a gate input capacitor of the switching element M1 is charged, and a gate-source voltage of the switching element M1 gradually increases (an A-zone in FIG. 8(a)). During this time, an output current of the switching element M1 (a source current Is (≈a drain current Id) hardly flows.

After that, when the gate-source voltage Vgs of the switching element M1 exceeds the threshold voltage Vth, the source current Is (≈the drain current Id) starts to increase. Thus, the induction voltage Kp×dIs/dt depending on a change amount dIs/dt of the source current Is is superimposed in a forward direction (a B-zone in FIG. 8(a)). Then, increasing degrees of the source current Is and the drain current Id can be increased. Accordingly, a high-speed switching of the switching element M1 can be realized.

In the present embodiment, because the lower surface of the multilayer wiring board 8 is set to the mounted surface that is mounted on the main current wiring 6, the mounted surface of the multilayer wiring board 8 can be a flat surface. Thus, if the upper surface of the main current wiring 6 (the main current carrying substrate 4) is formed into a flat mounting surface, the multilayer wiring board 8 and the main current wiring 6 can come in close contact with each other by simply disposing the mounted surface of the multilayer wiring board 8 on the upper surface of the main current wiring 6. Accordingly, a large installation space is not necessary surrounding the main current wiring 6. Because the multilayer wiring board 8 is disposed on the main current wiring 6 (the main current carrying substrate 4), more magnetic fluxes can interlink with the coil L.

The length I between the winding ends of the coil L is less than or equal to the wiring width W of the main current wiring 6 and the coil L is disposed within the wiring width W of the main current wiring 6. Thus, many magnetic flux generated depending on electric current flowing in the main current wiring 6 can interlink with the coil L, and a magnetic flux generated depending on electric current flowing a current path other than the main current path is restricted from interlinking with the coil L as much as possible. Thus, the detection accuracy by the coil L can be improved, and the noise resistance can be improved.

Because the coil L is formed by the combination of the metal wirings (wiring patterns) 10 formed in the respective layers 8a-8d in the multilayer wiring board 8 and the through holes H1-H6 connecting the metal wirings 10 in the loop-shape, the coil L can be compactly embedded in the multilayer wiring board 8. Accordingly, the coil L can be formed inexpensively. In addition, because an iron core or a ferrite core is unnecessary, a cost reduction can be realized.

Also in a manufacturing method, a winding process is unnecessary. Thus, a cost reduction can be realized. Because the upper surface of the main current wiring 6 is coated with insulation material such as solder resist, insulation between the coil L and the main current wiring 6 and the like can be maintained.

(Second Embodiment)

A drive circuit for a switching element according to a second embodiment of the present disclosure will be described with reference to FIG. 9(a) though FIG. 9(d).

As illustrated in FIG. 9(a) through FIG. 9(d), connection terminals 11a and 11b are disposed adjacent to the connection terminals 9a and 9b, respectively, and the connection terminals 11a and 11b are connected by through holes penetrating the first layer 8a through the fourth layer 8d.

As illustrated in FIG. 9(a) through FIG. 9(d), the through holes H1-H6 are arranged in zigzags similarly to the above-described embodiment, and the metal wirings 10 connect the respective through holes H1-H6 in order on the first layer 8a and the third layer 8c. In the present embodiment, a through hole H7 is further arranged in zigzags with respect to the through holes H1-H6, and a metal wiring 10 connects the through hole H7 and the connection terminal 9a. In addition, a metal wiring 10 connects the through hole H1 and the connection terminal 11b.

Accordingly, a carrying path of electric current is formed to pass the connection terminal 9a, the through hole H7, the metal wiring 10 between H7 and H6 in the third layer 8c, the through hole H6, the metal wiring 10 between H6 and H5 in the first layer 8a, the through hole H5, the metal wiring 10 between H5 and H4 in the third layer 8c, the through hole H4, . . . , the through hole H1, and the metal wiring 10 between H1 in the third layer 8c and the connection terminal 11b.

Figure 9A:
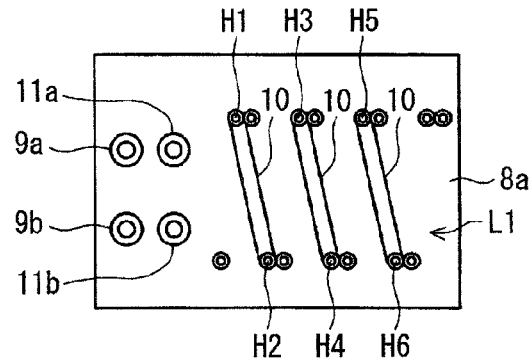
FIG. 9(a) is a plan view illustrating a wiring pattern of a first layer in a multilayer wiring board in a drive circuit for a switching element according to a second embodiment of the present disclosure.
Figure 9B:
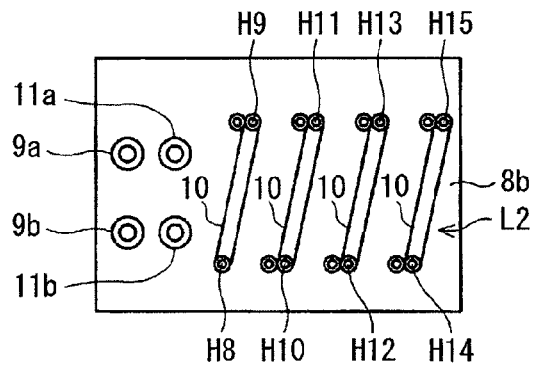
FIG. 9(b) is a plan view illustrating a wiring pattern of a second layer in the multilayer wiring board.
Figure 9C:
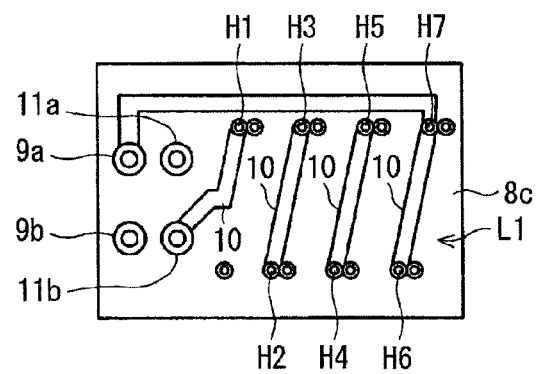
FIG. 9(c) is a plan view illustrating a wiring pattern of a third layer in the multilayer wiring board.

Thus, a partial coil L1 wound in a predetermined direction (when viewed from a left side of FIG. 9(a) through FIG. 9(d), a clockwise direction; a right winding) is formed between the first layer 8a illustrated in FIG. 9(a) and the third layer 8c illustrated in FIG. 9(c).

As illustrated in FIG. 9(a) through FIG. 9(d), the layers 8a-8d of the multilayer wiring board 8 are connected with each other via through holes H8-H15 arranged in zigzags in a plane from a side of the multilayer wiring board 8 close to the connection terminals 9a and 9b to an opposite side.

On the second layer 8b, metal wirings 10 connect the through holes H8 and H9, H10 and H11, H12 and H13, and H14 and H15. On the fourth layer 8d, metal wirings 10 connect through holes H9 and H10, H11 and H12, H13 and H14, and the through hole 15 and the connection terminal 11a.

Then, a carrying path of electric current is formed to pass the connection terminal 11a, the metal wiring 10 between the connection terminal 11a and the through hole H15 in the fourth layer 8d, the through hole H15, the metal wiring 10 between H15 and H14 in the second layer 8b, the through hole H14, the metal wiring 10 between H14 and H13 in the fourth layer 8d, the through hole H13, . . . , the through hole H8, and the metal wiring 10 between the through hole H8 and the connection terminal 9b.

Figure 9D:
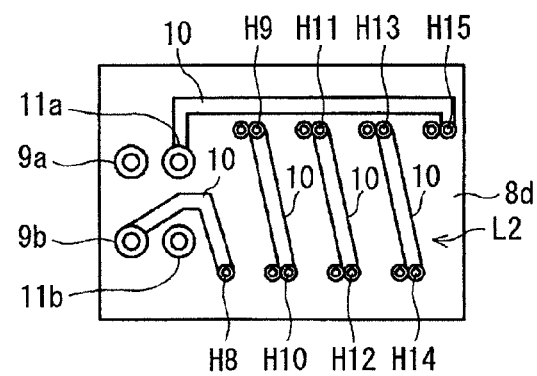
FIG. 9(d) is a plan view illustrating a wiring pattern of a fourth layer in the multilayer wiring board.

Thus, a partial coil L2 wound in a direction opposite from the above-described direction (when viewed from the left side of FIG. 9(a) through FIG. 9(d), a counterclockwise direction; a left winding) is formed between the second layer 8b illustrated in FIG. 9(b) and the fourth layer 8d illustrated in FIG. 9(d).

When mounting, the coil can be formed in a state where the partial coil L1 and L2 are connected in series by connecting and short-cutting the connection terminals 11a and 11b. In the present embodiment, the partial coil L1 and the partial coil L2 are connected in series. Because the partial coil L1 and the partial coil L2 are wound in directions opposite from each other, a tolerance with respect to disturbance noises can be increased. In addition, because the partial coil L1 is formed between the first layer 8a and the third layer 8c and the partial coil L2 is formed between the second layer 8b and the fourth layer 8d, a magnetic flux interlinkage regions between the partial coils L1 and L2 can be formed to overlap, and the tolerance with respect to disturbance noises can be increased.

Although the embodiment in which the partial coil L1 is formed between the first layer 8a and the third layer 8c and the partial coil L2 is formed between the second layer 8b and the fourth layer 8d has been described, the partial coil L1 may be formed between the first layer 8a and the second layer 8b and the partial coil L2 may be formed between the third layer 8c and the fourth layer 8d.

(Third Embodiment)

A drive circuit for a switching element according to a third embodiment of the present disclosure will be described with reference to FIG. 10.

Figure 10:
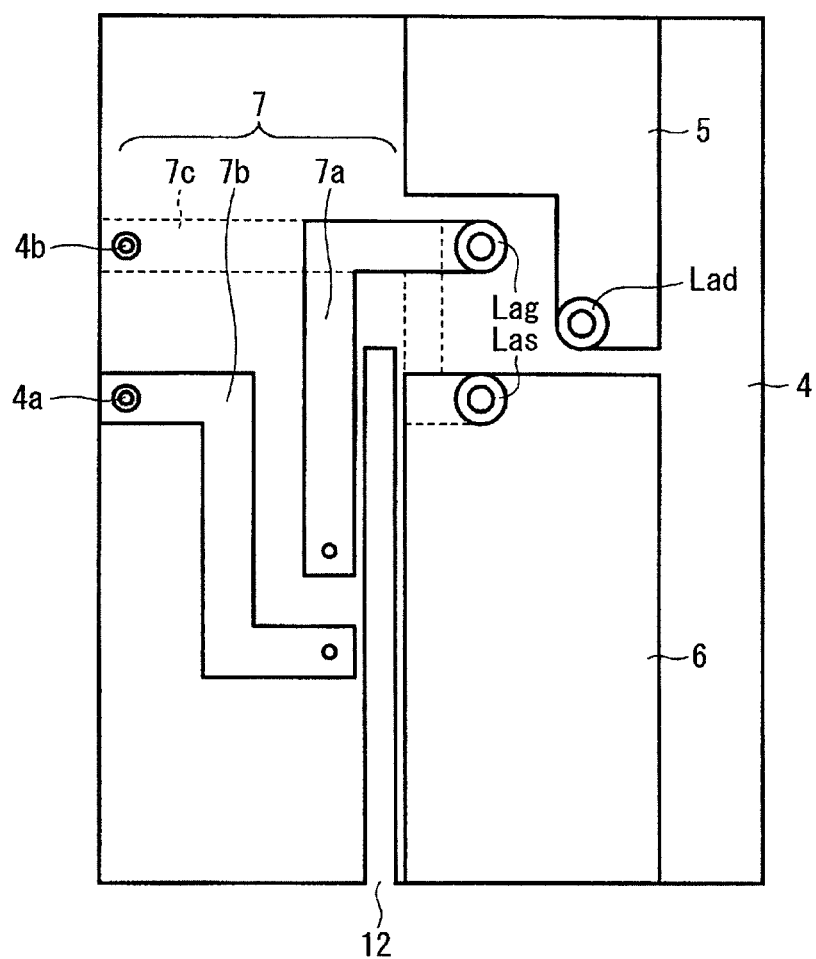
FIG. 10 is a plan view of a portion including a connection portion of a switching element and a coil in a drive circuit for a switching element according to a third embodiment of the present disclosure.

In FIG. 10, a configuration of the multilayer wiring board 8 illustrated in FIG. 2(a) is omitted. As illustrated in FIG. 10, a slit 12 is located near a current path of the main current wiring 6 and is formed along the main current wiring 6. The slit 12 is formed between the main current wiring 6 carrying the source current Is and the wirings 7a and 7b. The slit 12 is also formed between the land Las for connecting the source lead terminal Les and the wiring 7a. Accordingly, a capacity coupling between the gate voltage application wiring 7 and the main current wiring 6 can be restricted.

In particular, in a case where a part or the whole of the wirings 7a-7c of the gate voltage application wiring 7 extends in parallel with the main current wiring 6, noises may superimpose on the gate application voltage Vgin due to the capacity coupling. Thus, in the present embodiment, the slit 12 is provided to secure insulation, and thereby influence of noises can be restricted as much as possible.

(Fourth Embodiment)

Figure 11:
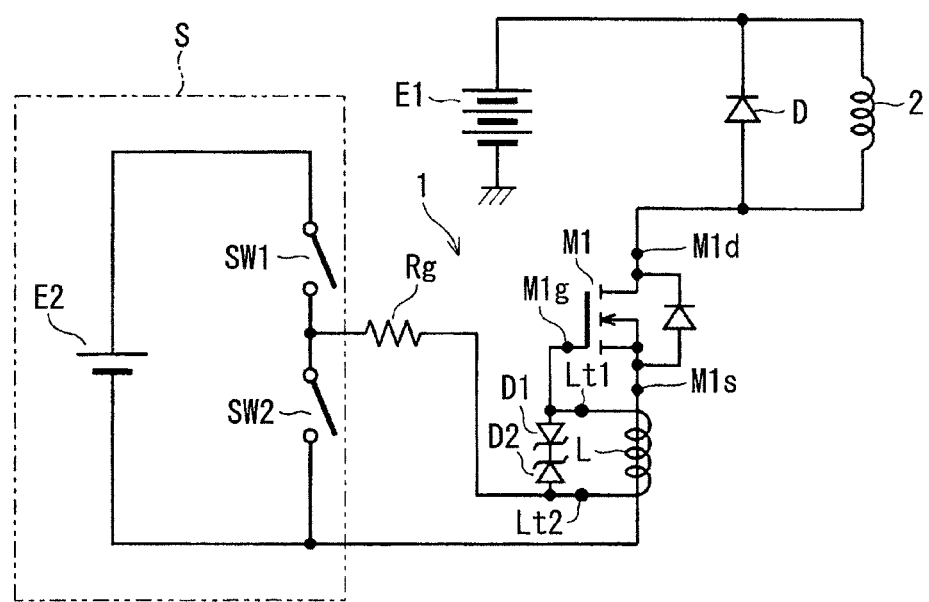
FIG. 11 is a circuit diagram illustrating an example of a drive circuit for a switching element according to a fourth embodiment of the present disclosure.

A drive circuit for a switching element according to a fourth embodiment of the present disclosure will be described with reference to FIG. 11. As illustrated in FIG. 11, between the one terminal Lt1 and the other terminal Lt2 of the coil L, Zener diodes D1 and D2 are connected in directions opposite from each other. Accordingly, when an induction voltage is excessively generated at the coil L, the induction voltage can be clamped at a predetermined voltage.

(Fifth Embodiment)

A drive circuit for a switching element according to a fifth embodiment of the present disclosure will be described with reference to FIG. 12.

Figure 12:
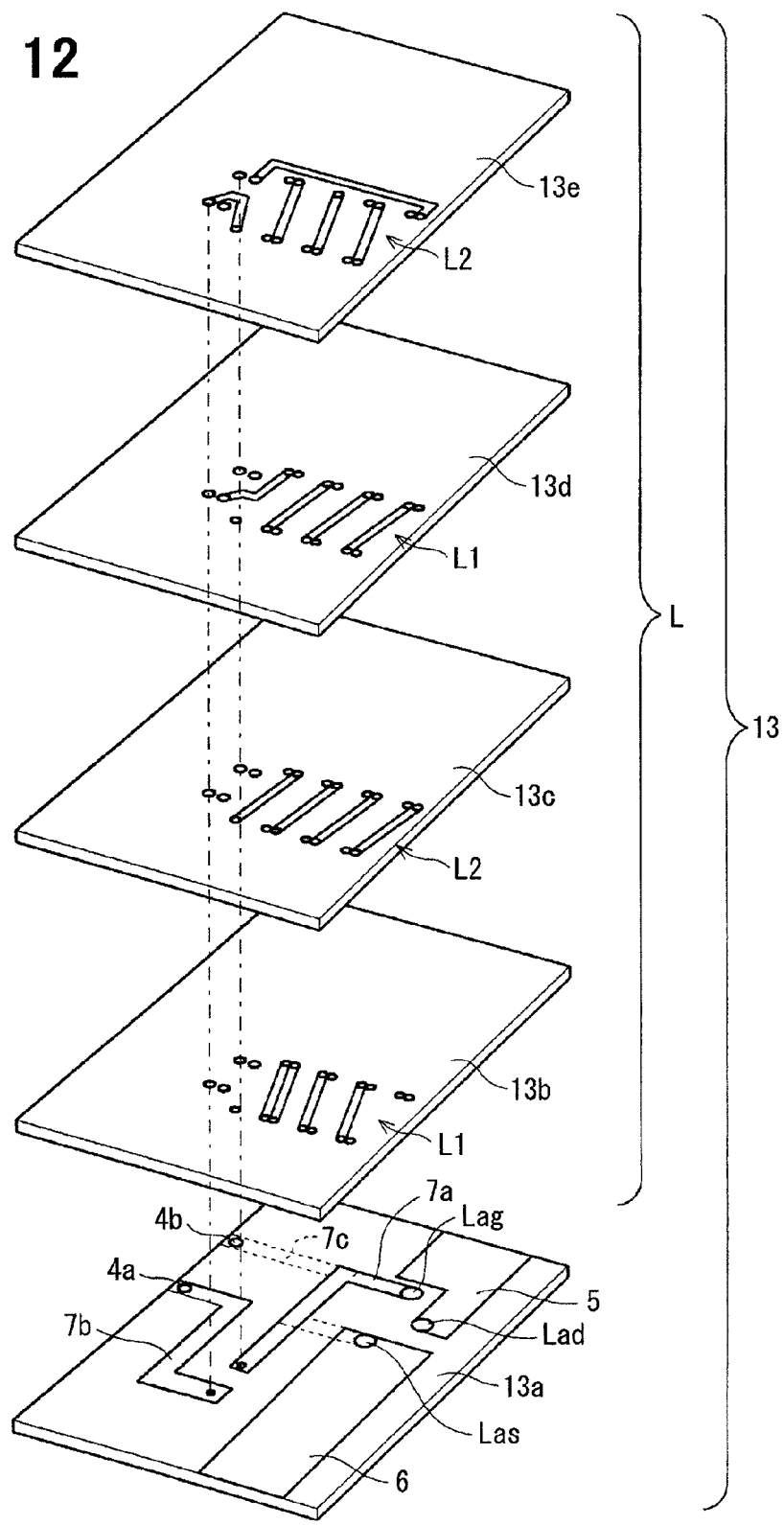
FIG. 12 is an exploded perspective view illustrating a layer structure of a multilayer wiring board in a drive circuit for a switching element according to a fifth embodiment of the present disclosure.

As illustrated in FIG. 12, a multilayer wiring board 13 according to the present embodiment has a five-layer structure including a first layer 13a, a second layer 13b, a third layer 13c, a fourth layer 13d, and a fifth layer 13e. On the second layer 13b through the fifth layer 13e, wiring patterns similar to the wiring patterns on the first layer 8a through the fourth layer 8d illustrated in FIG. 9(a) through FIG. 9(d) (the metal wirings 10 and the through holes H1-H15) are respectively formed. On the first layer 13a, wiring patterns similar to the wiring patterns formed on the main current carrying substrate 4 (the main current wirings 5, 6 and the gate current application wiring 7) are formed.

Thus, when the first layer 13a through the fifth layer 13e are integrally formed into the multilayer wiring board 13, both of the coil L (the partial coils L1, L2) and the main current wiring 6 can be mounted on the multilayer wiring board 13, and time and effort of separating mounting the coil L and the main current wiring 6 are unnecessary.

(Sixth Embodiment)

Figure 13:
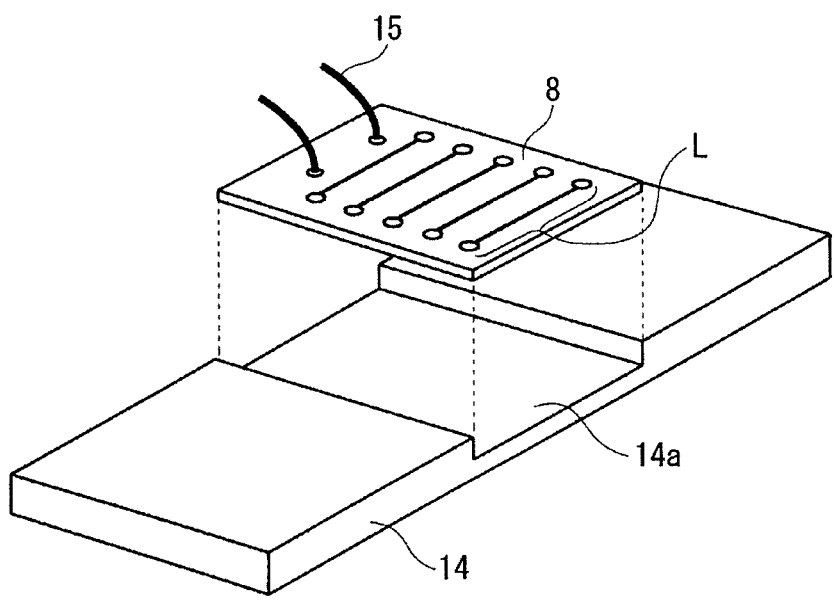
FIG. 13 is a perspective view illustrating an arrangement relationship between a coil and a main current wiring in a drive circuit for a switching element according to a sixth embodiment of the present disclosure.

A drive circuit for a switching element according to a sixth embodiment of the present disclosure will be described with reference to FIG. 13. In the present embodiment, the coil L is embedded in a main current wiring.

In the above-described embodiments, the main current wirings 5, 6 are formed of copper films on the main current carrying substrate 4. However, configurations are not limited to the above-described embodiments. Namely, as illustrated in FIG. 13, a conductive plate 14 having a predetermined thickness may be formed instead of the main current wirings 5, 6 of the above-described embodiments, a depressed portion 14a may be formed at a part of the conductive plate 14, and the multilayer wiring board 8 may be mounted on the depressed portion 14a.

A lower surface of the depressed portion 14a of the conductive plate 14 becomes a mounting surface of the multilayer wiring board 8. A depressed surface of the depressed portion 14a of the conductive plate 14 is formed into a flat surface and the multilayer wiring board 8 is mounted on the lower surface of the depressed portion 14a. An induction voltage of the coil L can be acquired by connecting a wiring 15. Also by this configuration, a magnetic flux generated depending on electric current flowing in the conductive plate 14 can interlink with the coil L in the multilayer wiring board 8.

(Other Embodiments)

The present disclosure is not limited to the above-described embodiments and can be modified or expanded, for example, as described below. The winding number and the coil width w of the coil L may be changed optionally. The embodiments in which the multilayer wiring board 8 is closely mounted on the main current wiring 6 for the source current Is so that the induction voltage depending on the source current Is is superimposed on the gate application voltage Vgin have been described. However, the present disclosure is not limited to this. For example, the multilayer wiring board 8 may also be closely mounted on the main current wiring 5 for the drain current Id so that an induction voltage depending on the drain current Id is superimposed on the gate application voltage Vgin.

The embodiments in which the coil L is formed using the through holes H1-H6 penetrating all of multiple-layer structure of the multilayer wiring board 8 and the metal wirings 10 have been described. However, the coil L may also be formed using via holes connecting any layers of the multilayer wiring board 8 (e.g., the first layer 8a and the second layer 8b, the second layer 8b and the third layer 8c, or the third layer 8c and the fourth layer 8d).

In the above-described embodiments, the present disclosure is applied to the drive circuit 1 for driving the inductive load 2. However, application of the present disclosure is not limited to this particularly and the present disclosure may also be applied to a drive circuit for driving a circuit including a switching element M1 such as a DCDC converter.

The invention claimed is:

1. A drive circuit comprising:
a switching element on-off controlled depending on a pulse signal transmitted from a signal source and carrying a main current;
a main current wiring having a flat surface and carrying the main current of the switching element; and
a substrate having a flat surface mounted on a flat surface of the main current wiring, and having a coil disposed therein,
wherein the coil is disposed so as to interlink with a magnetic flux generated depending on the main current of the switching element and is electrically connected such that the coil receives the pulse signal of the signal source and transmits the pulse signal to a control terminal of the switching element.

2. The drive circuit according to claim 1, further comprising
a gate resistor electrically connected with a control terminal of the switching element,
wherein the coil is connected in series with the gate resistor.

3. The drive circuit according to claim 1,
wherein a distance between winding ends of the coil is less than or equal to a wiring width of the main current wiring and the coil is disposed in the wiring width of main current wiring.

4. The drive circuit according to claim 1,
wherein the substrate includes a multilayer wiring board and
wherein the coil is formed by combining wiring patterns formed on respective layers in the multilayer wiring board with via holes connecting the wiring patterns on the respective layers in a loop shape.

5. The drive circuit according to claim 4,
wherein the coil is formed of partial coils connected in series and wound in loop shapes in directions opposite to each other in the multilayer wiring board.

6. The drive circuit according to claim 5,
wherein the multilayer wiring board includes a first layer a second layer, a third layer, and a fourth layer in order, and
wherein the coil includes a first partial coil and a second partial coil, the first partial coil structurally connects the wiring patterns formed on the first layer and the third layer in the multilayer wiring board with the via holes, the second partial coil is wound in the direction opposite to the first partial coil and structurally connects the wiring patterns formed on the second layer and the fourth layer with the via holes.

7. The drive circuit according to claim 4,
wherein the multilayer wiring board is formed by embedding the main current Wiring with the coil.

8. The drive circuit according claim 1, further comprising
a control terminal connecting wiring pattern connected with a control terminal of the switching element and formed on a main current carrying substrate in which the main current wiring is formed, and
wherein a slit is provided between the control terminal connecting wiring pattern and the main current wiring.

9. The drive circuit according claim 1, further comprising
a Zener Diode clamping an induction voltage generated in the coil.

10. The drive circuit according claim 1, further comprising the signal source.

* * * * *